(12) United States Patent
Ramkumar et al.

(10) Patent No.: US 7,094,707 B1
(45) Date of Patent: Aug. 22, 2006

(54) METHOD OF FORMING NITRIDED OXIDE IN A HOT WALL SINGLE WAFER FURNACE

(75) Inventors: Krishnaswamy Ramkumar, San Jose, CA (US); Sundar Narayanan, Santa Clara, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/142,963

(22) Filed: May 13, 2002

(51) Int. Cl.
 *H01L 23/58* (2006.01)
(52) U.S. Cl. ............... 438/775; 439/791; 439/216; 439/288; 257/411; 257/405
(58) Field of Classification Search ........ 257/360–411; 438/93, 200–275
See application file for complete search history.

(56) References Cited

U.S. PATENT DOCUMENTS

| 5,403,786 | A | | 4/1995 | Hori |
| 5,521,127 | A | | 5/1996 | Hori |
| 5,629,221 | A | | 5/1997 | Chao et al. |
| 5,766,994 | A | | 6/1998 | Tseng |
| 5,880,040 | A | | 3/1999 | Sun et al. |
| 6,087,268 | A | * | 7/2000 | Holloway et al. .......... 438/724 |
| 6,180,543 | B1 | | 1/2001 | Yu et al. |
| 6,198,138 | B1 | * | 3/2001 | Hirota |
| 6,265,268 | B1 | * | 7/2001 | Halliyal et al. ............. 438/261 |
| 6,355,579 | B1 | * | 3/2002 | Ra ............................. 438/775 |
| 6,372,581 | B1 | * | 4/2002 | Bensahel et al. |
| 6,399,520 | B1 | | 6/2002 | Kawakami et al. |
| 6,713,127 | B1 | * | 3/2004 | Subramony et al. |

OTHER PUBLICATIONS

Gusev, et al., "Growth and Characterization of Ultrathin Nitrided Silicon Oxide Films", IBM J. Res. Develop., 43, 3, 265-286 (1999).
Hook, et al., "Nitrided Gate Oxides for 3.3-V Logic Application: Reliability and Device Design Considerations", IBM J. Res. Develop., 43, 3, 393-406 (1999).
Buchanan, "Scaling the Gate Dielectric: Materials, Integration and Reliability", IBM J. Res. Develop., 43, 3, 245-264 (1999).
Evans, et al., "High Performance CMOS Devices with 20 Å Engineered Oxynitride Gate Dielectrics", Semicon Korea Technical Symposium (2000).
Riley, et al., "Rapid Thermal and Integrated Processing VI", Materials Research Society Symposium Proceedings, vol. 470, Apr. Symposium (1997).
van Zant, "Microchip Fabrication: A Practical Guide to Semiconductor Processing", McGraw-Hill, Fourth Edition, 156, 160, 188, 189, 503, 513 and 514, (2000).

* cited by examiner

*Primary Examiner*—Fetsum Abraham
(74) *Attorney, Agent, or Firm*—Merchant & Gould PC

(57) ABSTRACT

A method of nitriding a gate oxide layer by annealing a preformed oxide layer with nitric oxide (NO) gas in a hot wall, single wafer furnace is provided. The nitridation process can be carried out rapidly (i.e., at nitridation times of 30 seconds to 2 minutes) while providing acceptable levels of nitridation (i.e., up to 6 at. %) and desirable nitrogen/depth profiles. The nitrided gate oxide layer can optionally be reoxidized in a second oxidation step after the nitridation step. A gate electrode layer (e.g., boron doped polysilicon) can then be deposited on top of the nitrided gate oxide layer or on top of the reoxidized and nitrided gate oxide layer.

21 Claims, 1 Drawing Sheet

METHOD OF FORMING NITRIDED OXIDE IN A HOT WALL SINGLE WAFER FURNACE

BACKGROUND OF THE INVENTION

1. Field of the Invention

This invention relates, in general, to a process for fabricating integrated circuit devices in which a layer of nitrided oxide material is formed and, in particular, to a method of forming nitrided oxide using a hot wall single wafer furnace.

2. Background of the Technology

Semiconductor devices such as MOS (metal-oxide-semiconductor) devices are typically formed on a substrate such as a silicon wafer. Typically, one or more films of an insulating material such as silicon dioxide are formed on the substrate over which is formed a gate electrode. The insulating film formed between the gate electrode and the silicon substrate is referred to as the gate oxide or gate dielectric. A widely employed type of MOS device is a complementary metal-oxide-semiconductor device, or CMOS device.

Boron doping of the gate electrodes of MOS devices (e.g., $p^+$ gates) has been used to improve device performance by reducing short-channel effects and lowering threshold voltages. Typically, boron is implanted into the poly-Si gate at sufficiently high concentrations to ensure adequate conductance of the poly-Si gate. With the continued push for smaller and smaller MOS device dimensions, however, higher active dopant concentrations are required. When boron is used as the dopant for $p^+$ gates, boron atoms in the gate layer can diffuse into the gate dielectric during downstream processing. Boron, which is a relatively small atom, has a very high diffusion coefficient in both silicon and silicon dioxide at temperatures encountered during processing. Further, it is necessary to activate the boron dopant after implantation with a high-temperature anneal which is typically conducted at temperatures in the range of 950–1050° C. During this high-temperature anneal, boron diffusion can be exacerbated.

Boron penetration into and through the gate dielectric can also have significant effects on device characteristics. First, boron penetration through the gate dielectric and into the channel can influence device performance. Boron diffusion into the channel, for example, can result in a shift in the threshold voltage of the device and can even result in charge-induced damage and breakdown during device operation. Also, as boron penetrates into the gate dielectric layer, the capacitance-voltage (C-V) or flat-band voltage of the device can shift which can degrade device performance. The presence of boron in the gate oxide film can also degrade the quality of the gate oxide film.

The reduction of boron penetration is particularly important in light of the decreasing dielectric layer thicknesses of modern MOS devices. It is known to incorporate nitrogen into an oxide film to retard the effects of boron penetration Nitrogen is believed to block boron diffusion by forming B-N complexes.

The amount of nitrogen incorporated into the gate oxide generally determines the effectiveness of the oxide layer in blocking boron diffusion. The amount of nitrogen doping required in a particular application, however, is dictated in part by the thermal cycles to which the device is subjected after deposition and doping of the gate electrode. Typical amounts of nitrogen required for adequate levels of boron diffusion blocking are in the range of 1–3 at. %.

Nitrogen has been incorporated into $SiO_2$ using various methods. These methods include thermal oxidation followed by annealing in a nitrogen containing environment (thermal nitridation) and various deposition techniques such as physical vapor deposition (PVD) and chemical vapor deposition (CVD).

Various nitrogen containing gases have been employed for thermal nitridation and oxy-nitride deposition, including $N_2$, $NH_3$, NO and $N_2O$. See, for example, U.S. Pat. Nos. 5,403,786; 5,521,127; 5,629,991; and 5,880,040. See also Gusev et al., "Growth and Characterization of Ultrathin Nitrided Silicon Oxide Films", in IBM J. Res. Develop., Vol. 43, No. 3, pp. 265–286 (1999); Hook et al., "Nitrided Gate Oxides for 3.3-V Logic Application: Reliability and Device Design Considerations", in IBM J. Res. Develop., Vol. 43, No. 3, pp. 393–406 (1999); and Buchanan, "Scaling the Gate Dielectric: Materials, Integration and Reliability", in IBM J. Res. Develop., Vol. 43, No. 3, pp. 245–264 (1999). Evans et al. disclose a high pressure (15–25 atm.) process for oxynitride gate formation using nitric oxide gas. See Evans et al., "High Performance CMOS Devices with 20 Å Engineered Oxynitride Gate Dielectrics", Paper Presented at Semicon Korea Technical Symposium, (February 2000). Kuehne et al. disclose rapid thermal nitridation of gate oxide layers using nitric oxide gas. Kuehne et al., Papers Presented at the Materials Research Society Spring 1997 Meeting, Rapid Thermal Processing, Kyoto (Spring 1997).

Current methods of nitriding gate dielectric layers involve annealing wafers in nitrous oxide gas at temperatures of about 900° C. Annealing is typically conducted in a batch process involving 100–160 wafers in each run. Conventional nitridation methods, however, can result in a relatively low concentration of nitrogen in the films. For example, oxide films that were either grown or annealed in $N_2O$ typically have total integrated nitrogen concentrations of less than 1 at. %. These relatively low concentrations of nitrogen are usually insufficient to reduce the effects of boron penetration from a $p^+$ poly-Si gate into and through the gate dielectric layer. In order to incorporate sufficient amounts of nitrogen in the gate oxide layer, annealing has typically been conducted at relatively high temperatures (e.g., 900° C. and greater) and/or for relatively long times.

Current nitridation methods also tend to result in appreciable boron concentrations in the silicon channel layer at significant distances from the gate oxide/channel interface. The depth profile of the boron concentration should be such that the boron content as a function of distance from the gate oxide/channel interface drops rapidly on the channel side of the interface.

There still exists a need for a nitridation process which can rapidly incorporate sufficient amounts of nitrogen into the gate oxide layer of a MOS device. There also exists a need to form nitrided gate oxide layers having high concentrations of nitrogen in the gate oxide layer at the gate oxide/channel interface such that the concentration of boron dopant in the channel layer after activation of the dopant drops sharply as a function of the distance from the gate oxide/channel interface.

SUMMARY OF THE INVENTION

According to a first aspect of the invention, a method of nitriding a gate oxide layer on a semiconductor substrate is provided. The method comprises nitriding the gate oxide layer in the presence of nitric oxide (NO) gas in a single wafer, hot wall furnace. The nitriding step can be conducted at a temperature of from 900–1100° C. The nitriding step can be conducted for less than 2 minutes, preferably from 30 seconds to 2 minutes. A semiconductor substrate made by a method as set forth above is also provided.

According to a second aspect of the invention, a semiconductor device is provided. The semiconductor device comprises a semiconductor substrate layer; a nitrided gate oxide layer disposed on the substrate layer to form a gate oxide/substrate interface; and a boron doped gate electrode layer disposed on the nitrided gate oxide layer. The boron dopant in the gate electrode layer has been activated. For example, the boron dopant in the gate oxide layer can be activated by annealing at a temperature of 950–1050° C. According to this aspect of the invention, the boron concentration in the substrate layer at a distance of 5 nm or more from the gate oxide/substrate interface is no more than 1 percent, preferably no more than 0.5 percent, of the average boron concentration in the gate electrode layer. The gate electrode layer can be a polycrystalline silicon layer and the substrate layer can be a silicon layer.

BRIEF DESCRIPTION OF THE FIGURES

The invention will be described with reference to the accompanying figure, wherein.

DETAILED DESCRIPTION OF THE PREFERRED EMBODIMENTS

Figure 1:
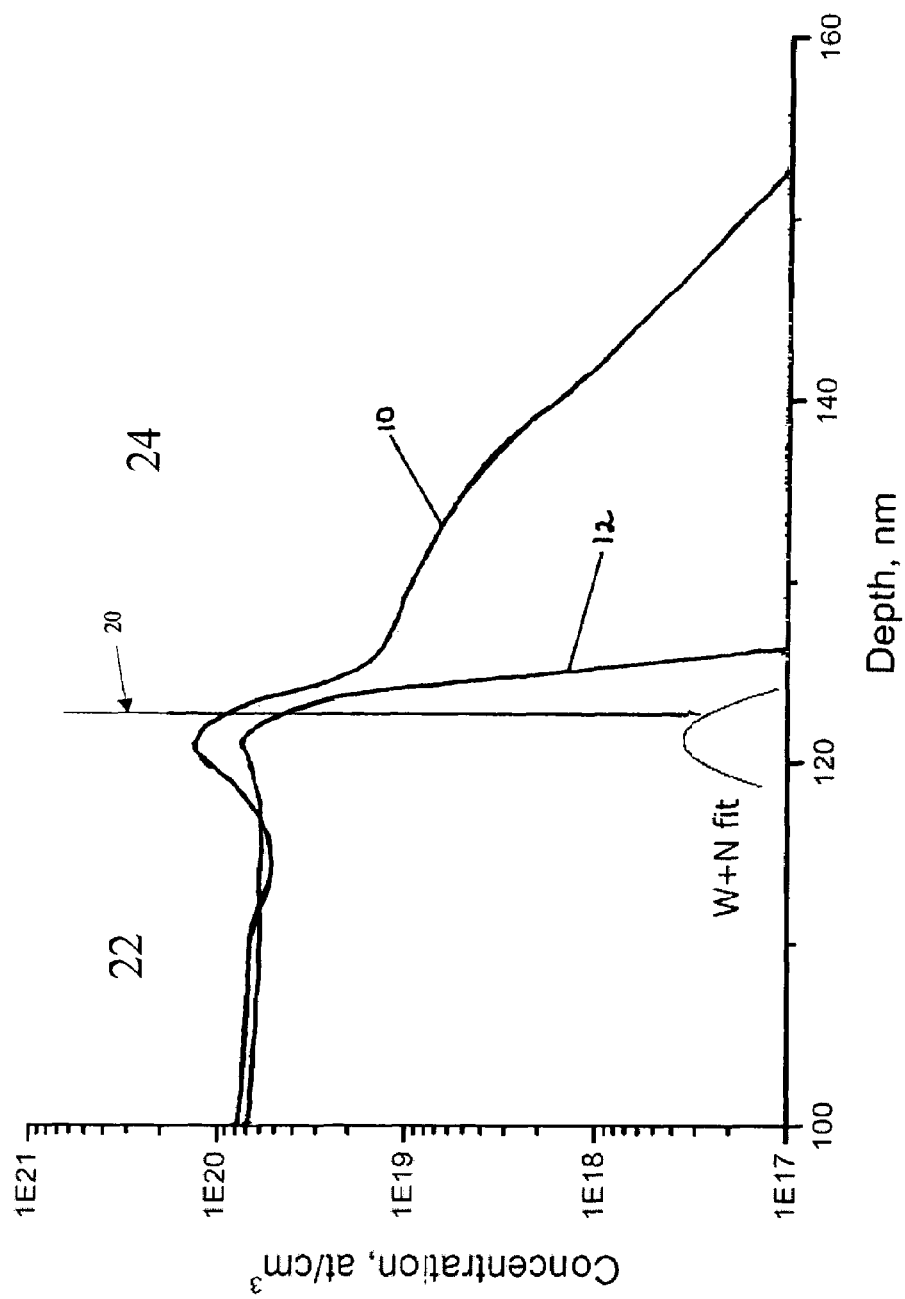
FIG. 1 is a graph comparing the concentration of boron as a function of depth (concentration/depth profile) near the gate oxide layer of an MOS device having a gate oxide layer nitrided in a conventional batch furnace compared to an MOS device having a gate oxide layer nitrided by annealing in a hot wall single wafer furnace according to the invention.

A conventional method for incorporating nitrogen into a gate oxide layer comprises annealing preformed oxide layers in a hot wall batch furnace. Annealing is typically conducted using nitrous oxide gas ($N_2O$). Annealing with $N_2O$, however, is generally not effective in incorporating more than 1–1.5 at. % of nitrogen into the gate oxide layer. Additionally, the nitridation anneal is typically conducted at high temperatures (e.g., >900° C.) for prolonged periods of time. The high annealing temperatures and long annealing times required for batch nitridation annealing may cause undesired diffusion of channel dopants such as boron.

Another disadvantage of annealing the gate oxide layer in nitrous oxide is that significant oxidation of the substrate may occur during the anneal process. The oxide formed during the nitrous oxide anneal can have poor uniformity and can thus degrade the overall uniformity of the gate oxide layer.

Batch processing can also lead to variations in the amount of nitrogen incorporated into the gate dielectric both within a single wafer and between wafers in a batch. Typically, 100–160 wafers are processed in a batch. In a batch furnace, the wafers are typically packed tightly together and stacked vertically in the furnace chamber. The nitriding gas generally flows from the top of the chamber to the bottom. Due to the tight packing of the wafers, more gas tends to reach the edge of the wafers than the center of the wafers leading to variations in nitrogen content within a wafer. Further, inherent temperature differences in a batch furnace chamber can cause the depletion of the nitriding gas before the gas contacts the wafers near the bottom of the furnace. In this manner, the wafers near the top of the furnace can have higher nitrogen contents than those near the bottom of the furnace.

The nitridation process according to the invention comprises annealing a semiconductor substrate (e.g., a silicon single crystal) having a preformed oxide layer (e.g., $SiO_2$) using a hot wall, single wafer furnace. According to a preferred embodiment of the invention, annealing is conducted on a substrate having a preformed oxide layer using nitric oxide (NO) gas. According to a further preferred embodiment, annealing is conducted for a period of 30 seconds to 2 minutes at a temperature of from 900–1100° C. According to the invention, the hot wall, single wafer furnace is maintained at a constant temperature and the substrates are processed one at a time.

By annealing the substrate in nitric oxide gas in a hot wall single wafer furnace according to the invention, large amounts of nitrogen can be incorporated into the gate dielectric layer in a relatively short time. Further, due to the nitrogen concentration/depth profile that can be achieved in the gate dielectric, improved boron blocking capabilities can be realized using a nitridation method according to the invention. Additionally, uniformity problems resulting from depletion of the nitriding species and gas flow and temperature non-uniformities in a batch furnace can be reduced or eliminated. As a result, the overall standard deviation of oxide thickness and the standard deviation of the percent nitrogen content of the gate oxide layer can be improved threefold. For an 8 inch wafer, within wafer standard deviations of from about 0.1 to about 0.16 Å can be obtained according to the invention. In one example, the within wafer standard deviation for oxide thickness was improved from about 0.3 using a conventional batch nitridation technique in a hot wall furnace to about 0.12 Å using a nitridation technique according to the invention.

Additionally, the standard deviation of nitrogen content between wafers processed using nominally the same process conditions (e.g., time, temperature, pressure, etc.) can be reduced to less than about 4 percent, preferably from about 1.5 to about 2.5 percent of the average nitrogen content of the gate oxide layer. This compares to a between wafer standard deviation of from 4 to 6 percent using a conventional batch nitridation process in a hot-wall furnace.

The process according to the invention offers additional advantages over a conventional nitridation anneal in a batch furnace. These advantages include the ability to rapidly (i.e., in 2 minutes or less) achieve high levels (i.e., up to 6 at. %) of nitrogen incorporation in the gate oxide layer. As a result, the nitridation process according to the invention can incorporate nitrogen into the gate oxide layer without resulting in excessive diffusion of dopants such as boron. Thus, for devices having boron doped gate electrode layers, the boron concentration as a function of depth after activation of the dopant drops abruptly at the gate oxide/channel interface. As a result, there is very little boron in the substrate or channel layer at a distance of 5–10 nm from the gate oxide/channel interface. For example, according to the invention, the concentration of boron in the substrate layer at a distance of 5 nm or more from the gate oxide/channel interface can be 1% or less, preferably 0.5% or less, of the average boron concentration in the gate electrode layer.

FIG. 1 is a graph showing boron concentration/depth profiles at a gate oxide/polysilicon interface using various nitridation techniques. In FIG. 1, silicon or channel layer 24, polysilicon layer 22 and gate oxide layer 20 are shown. For the data shown in FIG. 1, polysilicon layer 22 has been doped with boron and the boron dopant has been activated using a standard annealing process. In FIG. 1, the position of the gate oxide/polysilicon interface was aligned for all of the curves by determining the peak of the nitrogen concentration profile for each nitridation technique and aligning the position of the nitrogen peaks. Nitrogen and boron concentration as function of depth was determined using SIMS.

Boron concentration/depth profiles are shown in FIG. 1 for both nitridation of a gate oxide layer in a conventional hot-wall batch furnace 10 and nitridation using a hot wall single wafer furnace according to the invention 12.

As can be seen from FIG. 1, the annealing process has caused boron atoms to stack-up in gate electrode layer 22 near the interface between gate oxide layer 20 and gate electrode layer 22. Additionally, some boron atoms have diffused from gate electrode layer 22 into substrate or channel layer 24. The boron concentration in the polysilicon gate electrode layer 22 near the interface with gate oxide layer 20 for both wafers tested was approximately $7 \times 10^{19}$ at/cm$^3$. As can be seen from FIG. 1, however, the boron concentration drops significantly more rapidly in the substrate layer near the gate oxide/channel interface when the gate oxide layer is nitrided using a hot wall, single wafer furnace according to the invention. Boron concentration in FIG. 1 is measured in units of at/cm$^3$ and depth from the surface of the polysilicon gate electrode layer is measured in nm.

The initial or preformed oxide layer can be formed by any known oxide forming process. In a preferred embodiment of the invention, the initial oxide layer is a thermal oxide layer formed by reacting the substrate with an oxygen containing gas. According to a preferred embodiment of the invention, the substrate comprises silicon and the oxide layer comprises silicon dioxide (SiO$_2$). The thickness of the initial oxide layer can be chosen based on the requirements of the device being fabricated. The initial oxide layer according to the invention preferably has a thickness of less than 15 Angstroms. For example, the initial oxide layer can have a thickness of 8–15 Angstroms.

The nitrided gate oxide layer according to the invention can be subject to a reoxidation process. Additionally, a gate electrode layer can be deposited over the nitrided gate oxide layer or the reoxidized nitrided gate oxide layer according to the invention. The gate electrode layer can be any material used in the art. For example, the gate electrode material can be a polysilicon or a polycrystalline silicon germanium layer. The gate electrode may be a stack comprising a polysilicon or a polycrystalline silicon germanium layer and one or more additional layers. Suitable additional layers include tungsten and tungsten silicide. The gate electrode may also be doped with a dopant. Any art recognized dopant for gate electrodes (e.g., boron) can be employed according to the invention.

These and other modifications and variations to the present invention may be practiced by those of ordinary skill in the art, without departing from the spirit and scope of the present invention. Furthermore, those of ordinary skill in the art will appreciate that the foregoing description is by way of example only, and is not intended to limit the invention.

What is claimed is:

1. A method of nitriding a gate oxide layer on a semiconductor substrate comprising:
    nitriding the gate oxide layer in the presence of nitric oxide (NO) gas;
    wherein the nitriding step is conducted in a single wafer, hot wall furnace.

2. The method of claim 1, wherein the gate oxide layer is nitrided at a temperature of from 900–1100° C.

3. The method of claim 2, wherein the gate oxide layer is nitrided for 30 seconds to 2 minutes.

4. The method of claim 2, further comprising depositing a gate electrode layer on top of the nitrided gate oxide layer on the substrate.

5. The method of claim 2, wherein the gate oxide layer is nitrided for 2 minutes or less.

6. The method of claim 5, wherein the nitrogen concentration in the gate oxide layer after nitriding is at least 2 at. %.

7. The method of claim 5, wherein the nitrogen concentration in the gate oxide layer after nitriding is from about 4 at. % to about 6 at. %.

8. The method of claim 1, further comprising oxidizing the nitrided gate oxide layer on the substrate.

9. The method of claim 1, further comprising depositing a gate electrode layer on top of the nitrided gate oxide layer on the substrate.

10. The method of claim 9, further comprising doping the gate electrode layer with a dopant.

11. The method of claim 10, wherein the dopant is boron.

12. A semiconductor substrate made by the method of claim 1.

13. The semiconductor substrate of claim 12, wherein the semiconductor substrate is a CMOS device.

14. The semiconductor substrate of claim 12, wherein the standard deviation of the oxide thickness on the substrate after nitriding is from about 0.1 to about 0.16 Å.

15. The semiconductor substrate of claim 14, wherein the substrate has a nominal diameter of 8 inches.

16. A plurality of semiconductor substrates each made by the method of claim 1, wherein the standard deviation of nitrogen content between the substrates is less than about 4 percent.

17. A semiconductor device comprising:
    a semiconductor substrate layer;
    a nitrided gate oxide layer disposed on the substrate layer to form a gate oxide/substrate interface; and
    a boron doped gate electrode layer disposed on the nitrided gate oxide layer;
    wherein the boron dopant in the gate electrode layer has been activated, and wherein the boron concentration in the semiconductor substrate layer at a distance of 5 nm or more from the gate oxide/substrate interface is no more than 1 percent of the average boron concentration in the gate electrode layer.

18. The semiconductor device of claim 17, wherein the boron concentration in the substrate layer at a distance of 5 nm or more from the gate oxide/substrate interface is no more than 0.5 percent of the average boron concentration in the gate electrode layer.

19. The semiconductor device of claim 17, wherein the boron dopant has been activated by annealing at a temperature of 950–1050° C.

20. The semiconductor device of claim 17, wherein the average boron concentration in the gate electrode layer is at least $5 \times 10^{19}$ at/cm$^3$.

21. The semiconductor device of claim 17, wherein the substrate layer comprises silicon and wherein the gate electrode layer comprises polycrystalline silicon.

* * * * *